(12) United States Patent
Yamada et al.

(10) Patent No.: US 6,441,502 B2
(45) Date of Patent: Aug. 27, 2002

(54) MEMBER FOR MOUNTING OF SEMICONDUCTOR

(75) Inventors: Junichi Yamada; Hideki Sato; Kunihiro Tsubosaki; Yo Shimazaki, all of Tokyo (JP)

(73) Assignee: Dainippon Printing Co., Ltd., Tokyo (JP)

(*) Notice: Subject to any disclaimer, the term of this patent is extended or adjusted under 35 U.S.C. 154(b) by 0 days.

(21) Appl. No.: 09/746,842

(22) Filed: Dec. 23, 2000

(51) Int. Cl.⁷ ................................................ H01L 23/48
(52) U.S. Cl. .................... 257/786; 257/773; 257/784
(58) Field of Search ................................. 257/739, 773, 257/784, 786

(56) References Cited

U.S. PATENT DOCUMENTS 5,214,308 A * 5/1993 Nishiguchi et al. .... 228/180.22
6,111,311 A * 8/2000 Suzuki ........................ 257/691
6,172,423 B1 * 1/2001 Lee ............................. 257/685

FOREIGN PATENT DOCUMENTS

JP          11031756 A   *  2/1999   ........... H01L/23/12

* cited by examiner

Primary Examiner—Allan R. Wilson
(74) Attorney, Agent, or Firm—Flynn, Thiel, Boutell & Tanis, P.C.

(57) ABSTRACT

A member for mounting of semiconductor is comprised of a substrate, a concave portions for electrode and a concave portion for wire formed on one surface of the substrate, electrode terminals formed in the concave portions for electrode, and a wire formed in the concave portion for wire, in which the concave portions for electrode terminals are formed deeper than the concave portions for wire. In the pattern-forming process, resist pattern having an opening for wire and openings for electrode in which a width of the openings for electrode is larger than a width of the portion for wire is formed on one surface of a substrate. In the etching process, a substrate is half-cut by etching a substrate through the resist pattern as a mask so that concave portions for electrode and a opening for wire are formed on the surface of the substrate. In the plating process, the substrate is plated through the same resist pattern as a mask to form electrode terminals in the concave portions for electrode and a wire in the concave portion for wire. In the peeling process, the resist pattern is removed off from the substrate, so that a member for mounting of semiconductor can be obtained.

10 Claims, 14 Drawing Sheets

MEMBER FOR MOUNTING OF SEMICONDUCTOR

BACKGROUND OF THE INVENTION

(1) Field of the Invention

The present invention relates to a member for mounting of semiconductor used for producing a resin-sealed semiconductor device and a method for producing thereof.

(2) Description of the Prior Art

Heretofore, a member for mounting of semiconductor is known in which a substrate 102 is provided with a plurality of concave portions 103 for electrode terminal as shown in FIG. 17A, and electrode terminals 104 are formed in the concave portions 103. The production of a resin-sealed semiconductor device made by using the above-mentioned member 101 for mounting of semiconductor is usually carried out as follows. First, a semiconductor device 111 is mounted on a central flat area 102a of a substrate 102 in which electrode terminals 104 are not formed, and electrode pads 112 of the semiconductor device 111 and the electrode terminals 101 of the member 101 for mounting of semiconductor are electrically connected with each other through bonding wires 115. Then, the semiconductor device 111, the electrode terminals 104 and the bonding wires 115 are coated with resin part 117, and thereafter the substrate 102 of the member 101 for mounting of semiconductor is peeled off from the resin-sealed semiconductor device, which can be obtained (refer to FIG. 17B).

Such a member for mounting of semiconductor is produced by forming concave portions for electrode terminal in a substrate by the etching process and plating the inside of the concave portions to form electrode terminals. Namely, photosensitive resist is applied on a substrate, the photosensitive resist is exposed to light through a mask for forming of concave portions, the exposed photosensitive resist is developed to form a resist pattern. Then, the substrate is half-cut to form concave portions by etching the substrate through the resist pattern as a mask. Thereafter, the substrate is plated through the same resist pattern as a mask to form electrode terminals inside the concave portions However, since in recent years, the number of I/O was increased because of semiconductor device being made highly functional and because of the inside of semiconductor and buss being made high frequency, it became necessary to use ground in common by wiring around a member for mounting of semiconductor.

Heretofore, in order to meet such a necessity, after electrode terminals were formed in concave portions as above-mentioned, further a resist pattern for wire was formed on a substrate of a member for mounting of semiconductor, and the substrate was plated through the resist pattern for wire. FIG. 18A is a view showing an example of such a member for mounting of semiconductor. A member 101' for mounting of semiconductor is provided with a wire 106 which is needed to use ground, power and others in common, on a central flat area 102a of a substrate 102 in which electrode terminals 104 are not formed. In this member 101' for mounting of semiconductor, a semiconductor device 111 is mounted on the central flat area 102a in which the electrode terminals 104 and the wire 106 are not formed, thereafter electrode pads 112 of the semiconductor device 111 and the electrode terminals 104 and wire 106 of the member for mounting of semiconductor 101' are electrically connected with each other (FIG. 18B).

However, to produce the above-mentioned member 101' for mounting of semiconductor provided with wire 106, in the producing process thereof, two resist pattern-forming processes for forming of a resist pattern used for forming of concave portions 103 and for forming of a resist pattern used for forming of wire 106 are needed. Further, forming, matching of the shape of the second resist pattern formed in the second resist pattern-forming process with that of the first resist pattern formed in the first resist pattern-forming process is needed. Therefore, there is a problem that the producing process takes long time and is complicated. Further, since the above-mentioned matching is needed, arrangement of wire and electrode terminals is depends on the accuracy of the above-mentioned matching. Therefore, there is a limit in drawing fine wire. Such a problem results a hindrance to the reduction in the production cost of resin-sealed semiconductor device.

SUMMARY OF THE INVENTION

Therefore, considering the above-mentioned prior state, it is an object of the present invention to provide a member for mounting of semiconductor used for producing resin-sealed semiconductor device having a small size, high density, and high functionality, and a method for easily producing the member for mounting of semiconductor.

In order to achieve this object, a member for mounting of semiconductor according to the present invention comprises a substrate, concave portions for electrode and a concave portion for wire which are provided on one surface of the substrate, electrode terminals formed in the concave portions for electrode and a wire formed in the concave portion for wire, wherein the concave portions for electrode are formed deeper more than the concave portion for wire.

Further, in a member for mounting of semiconductor according to the present invention, a concave portion for mounting of semiconductor device is formed inside the concave portion for wire and a conductive layer is provided in the concave portion for mounting of semiconductor device.

A method for producing a member for mounting of semiconductor according to the present invention comprises the steps of: forming of resist pattern wherein a resist pattern is formed on one surface of a substrate, the resist pattern including openings for electrode for forming concave portions for electrode and opening for wire for forming concave portion for wire, wherein the width of the openings for electrode is larger than the width of the opening for wire; etching of the substrate wherein the substrate is half-cut by etching the substrate through the resist pattern as a mask so that concave portions for electrode and concave portion for wire are formed on one surface of the substrate; plating the substrate through the resist pattern as a mask so that electrode terminals are formed in the concave portions for electrode and wire is formed in the concave portions for wire and; thereafter peeling off the resist pattern from the substrate.

Further, In a method for producing a member for mounting of semiconductor, in the above-mentioned step of forming of resist pattern, the resist pattern which further includes an opening for mounting of semiconductor device inside an opening for wire is formed, in the etching process, the substrate is half-cut to form a concave portion for mounting a semiconductor device and in the plating step, conductive layer is formed on the concave portion for mounting of semiconductor device.

DESCRIPTION OF THE PREFERRED EMBODIMENT

Figure 1:
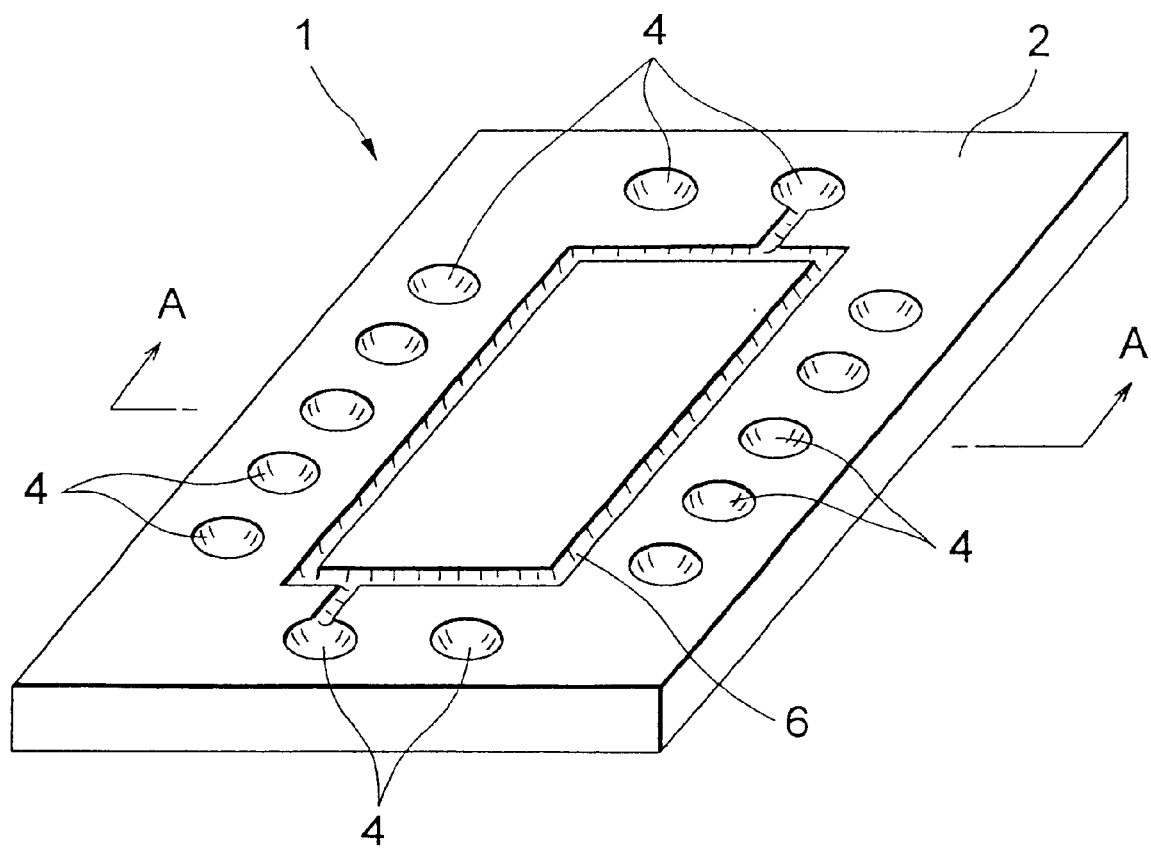
FIG. 1 is a perspective view showing one embodiment of a member for mounting of semiconductor of the present invention.

Then, referring to the drawings, embodiments of the present invention are explained.

Figure 2:
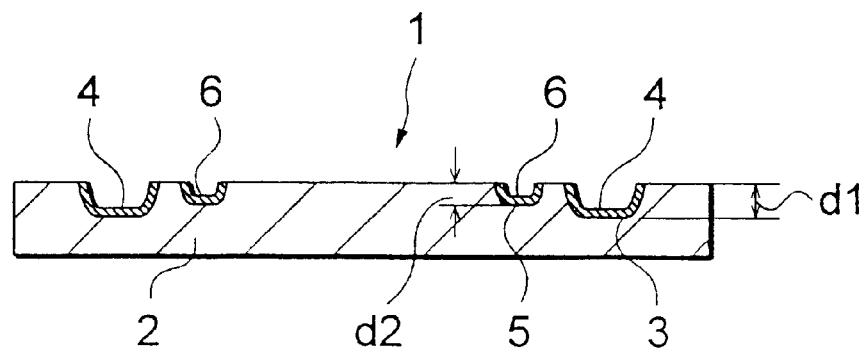
FIG. 2 is a vertical section taken on line A—A of the member for mounting of semiconductor shown in FIG. 1.

FIG. 1 is a perspective view showing one embodiment of a member for mounting of semiconductor of the present invention. FIG. 2 is a vertical section taken on line A—A of the member for mounting of semiconductor shown in FIG. 1. As shown in FIGS. 1 and 2, a member 1 for mounting of semiconductor of the present invention is comprised of a flat substrate 2, a plurality of concave portions 3 for electrode and a concave portion 5 for wire formed on one surface of the substrate 2, electrode terminals 4 formed in the concave portions 3 for electrode, and a wire 6 formed in the concave portion 5 for wire. The width d1 of the concave portions 3 for electrode is larger than that of the depth d2 of the concave portion 5 for wire, wherein the difference between the two is preferably 10 ■m to 50 ■m.

The substrate 2 is made of metal, for example, such as 42 alloy (alloy including 41% of Ni), copper, alloy of cupper and others. The thickness of the substrate 2 can be suitably determined according to the thickness d1 of the concave portions 3 for electrode which are to be formed, to be for example 100 ■m to 200 ■m.

Concave portions 3 for electrode are independently arranged which are provided with electrode terminals 4 on the inner walls thereof. The depth d1 of the concave form thereof can be set to be 50 ■m to 150 ■m, the width thereof can be set to be 200 ■m to 500 ■m. In the illustrated example, fourteen concave portions 3 for electrode are provided in substrate 2. However, this is merely illustration. The shape, the number, and the arrangement thereof can be suitably determined.

Electrode terminals 4 formed in the concave portions 3 for electrode forms outer terminals in a resin-sealed semiconductor device mentioned hereafter. Individual electrode terminal 4 is electrically independent from each other. Such electrode terminals 4 can be formed of thin film of one of noble metals of Ag, Pt, Au, Pd and others, or a laminated film made of combination of layers of these noble metals. Further, the electrode terminals 4 can be formed of a laminated film of a film of the above-mentioned noble metals and a film of metal such as Ni and others, wherein the latter laminated film is formed of layers more than three, and both outermost layers are formed of noble metals. The thickness thereof is 1 ■m to 20 ■m.

Concave portion 5 for wire is provided with wire 6 on the inner wall thereof. The depth d2 of the concave form thereof can be determined to be 10 ■m to 70 ■m, and the width thereof can be determined to be 30 ■m to 250 ■m. In the illustrated example, a con cave portion 5 for wire is formed into the shape of corridor in substrate 2. However this is merely illustration. The shape and the arrangement thereof can be suitably determined.

Further, wire 6 formed in concave portions 5 for wire is a wire for using ground, power and others in common. Such a wire 6 can be formed of thin film of one of noble metals of Ag, Pt, Au, Pd and others, or a laminated film made of combination of layers of these metals. Further, the wire can be formed of a laminated film of a film of the above-mentioned noble metals and a film of metal such as Ni and others, wherein both outermost layers are formed of noble metals. The thickness thereof is preferably 1 ■m to 20 ■m.

Then, a method for producing a member for mounting of semiconductor according to the present invention is explained.

FIG. 3 is a view of process showing one embodiment of a method for producing a member for mounting of semi-conductor of the present invention, giving as one example a member for mounting of semiconductor of the present invention shown in FIGS. 1 and 2.

Figure 3A:
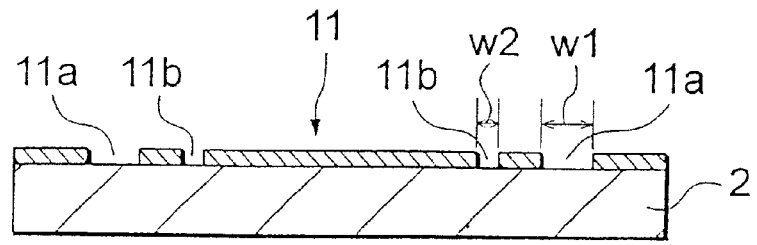
FIG. 3A to FIG. 3C are views of processes showing one embodiment of a method for producing a member for mounting of semiconductor of the present invention, giving as one example a member for mounting of semiconductor of the present invention shown in FIGS. 1 and 2.

As shown in FIG. 3, first, in the pattern-forming process, photosensitive resist is applied on a substrate 2. The photosensitive resist is exposed through the appointed photomask and developed, by which resist pattern 11 is made (FIG. 3A). Material that degreasing treatment and cleaning treatment are made on both sides thereof can be preferably applied for substrate 2. Further, if photosensitive resist has etching resistance and plating resistance, it can be used without restriction. For example, using dry film resist having etching resistance and plating resistance, exposure and development are made in the same manner, by which resist pattern 11 can be formed.

The resist pattern formed in the above-mentioned way has openings 11a for electrode for forming concave portions for electrode and an opening 11b for wire for forming concave portion for wire. In the present invention, the opening width W1 of openings 11a for electrode is set to be larger than the opening width W2 of opening 11b for wire. In such a manner, by setting the shape of resist pattern 11, the depth of half-cutting formed in the next process can be controlled every opening.

In this case, for example, when opening 11a for electrode is formed into square, the opening width W1 of opening 11a for electrode is the length of side of square; when opening 11a for electrode is formed into rectangle; the opening width W1 of opening 11a for electrode is the length of short side of rectangle; when opening 11a for electrode is formed into circle, the opening width W1 of opening 11a for electrode is a diameter and; when opening 11a for electrode is formed into ellipse, the opening width W1 of opening 11a for electrode is the length of short axis of ellipse. Even in case that opening 11b for wire is used for forming concave portion 5 for wire having the shape of corridor as shown in FIG. 1, the width of wire is the width of opening.

Figure 3B:
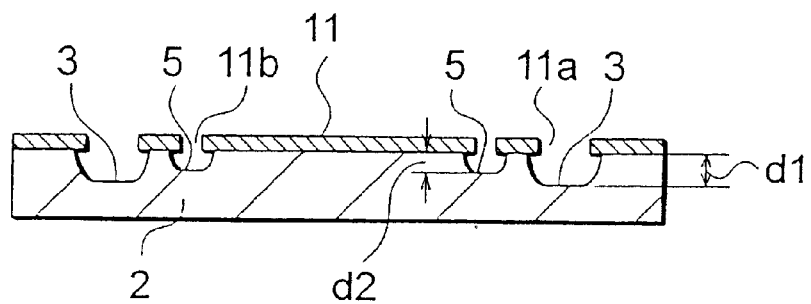

Then, in the etching process, substrate 2 is half-cut to form concave portions 3 for electrode and a concave portion 5 for wire on one surface of the substrate 2, by etching the substrate 2 through the resist pattern 11 as a mask (FIG. 3B). The depth d1 of the formed openings 3 for electrode is larger than the depth d2 of opening 5 for wire. As abovementioned, by changing the shape of resist pattern to control etching factor, the depth d1 of opening 3 for electrode and the depth d2 of opening 5 for wire can be controlled optionally.

In case that the width of a part of concave portion 5 for wire should be formed locally larger than other area without a change in depth, the etching rate can be controlled in the direction of depth by using resist pattern with mesh pattern in the corresponding part.

Etching, for example, spray etching can be made to half-cut substrate 2 from one side of substrate 2 on which resist pattern 11 is formed, by using solution of ferric chloride, ammonium persulfate and others according to material of substrate 2 as corrosive solution.

Figure 3C:
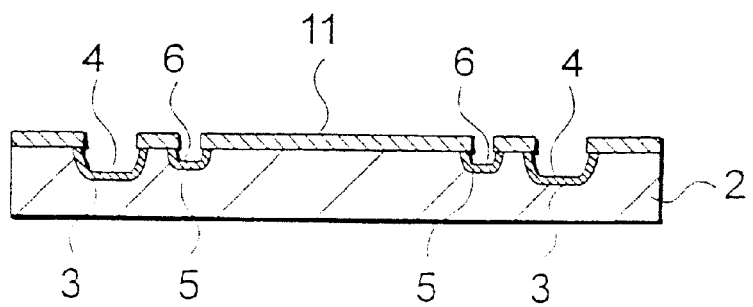

Then, in the plating process, by plating substrate 2 through the resist pattern 11 as a mask, electrode terminals 4 are formed in concave portions 3 for electrode, and a wire 6 is formed in concave portion 5 for wire (FIG. 3C). Since the resist pattern 11 used in the above-mentioned plating process can be used as a mask as it is in the plating process, a method for producing a member for mounting of semiconductor according to the present invention is different from the conventional production of a member for mounting of semiconductor having wire in which two resist pattern-forming processes are needed. Therefore, the number of process is decreased according to the present invention.

Further, by forming etching pattern and plating pattern for forming electrode terminals 4 and wire 6 to the common pattern, fine patterning is made possible without restriction about the accuracy of alignment.

Thereafter, in the peeling process, resist pattern 11 on substrate 2 is peeled off from substrate 2, and the substrate 2 is cleared, by which a member for mounting of semiconductor 1 according to the present invention as shown in FIGS. 1 and 2 can be obtained.

Then, the production of resin-sealed semiconductor device made by using a member for mounting of semiconductor according to the present invention is explained.

Figure 4:
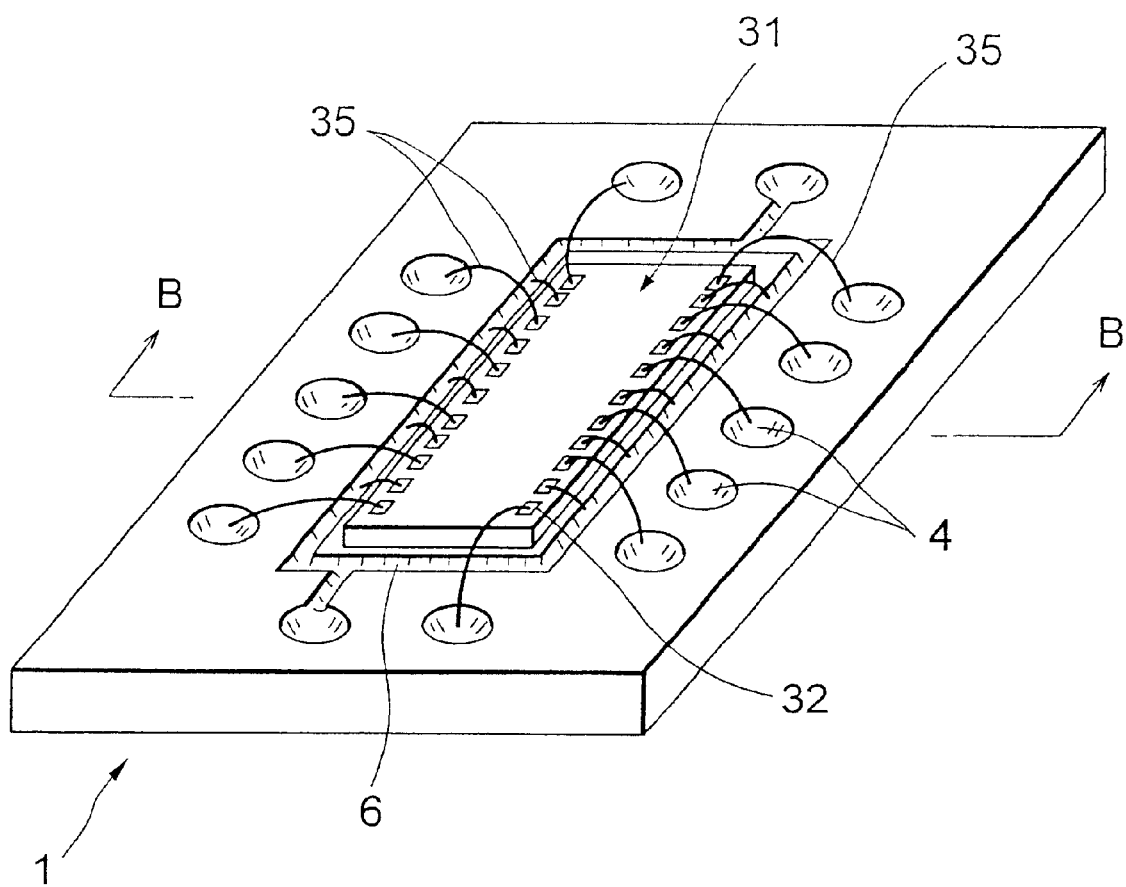
FIG. 4 is a view showing one example of the production of resin-sealed semiconductor device made by using a member for mounting of semiconductor of the present invention.

FIGS. 4 and 5 are a view showing one example of the production of resin-sealed semiconductor device made by using a member for mounting of semiconductor device of the present invention as shown in FIGS. 1 and 2.

Figure 5A:
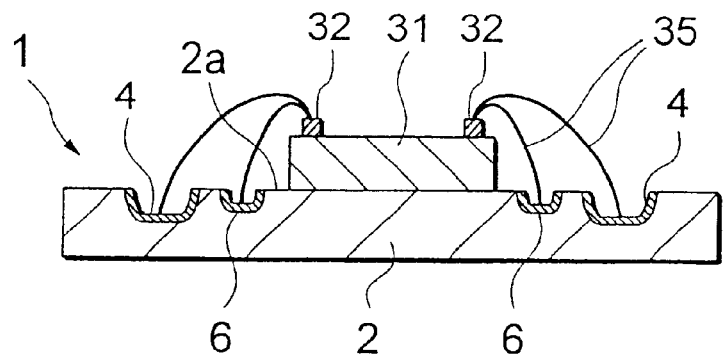
FIG. 5A to FIG. 5C are views of processes showing one example of the production of resin-sealed semiconductor device made by using a member for mounting of semiconductor device of the present invention.

First, as shown in FIGS. 4 and 5A, a semiconductor device 31 is mounted on a central flat area 2a of substrate 2 in which electrode terminals 4 and wire 6 are not formed, and electric connection of electrode pads 32 of the semiconductor device 31 with electrode terminals 4 and wire 6 is made through bonding wire 35. By the way, FIG. 5A is a vertical section taken on line B—B of FIG. 4, wherein bonding wire 35 being not positioned in the vertical section is also drawn.

Figure 5B:
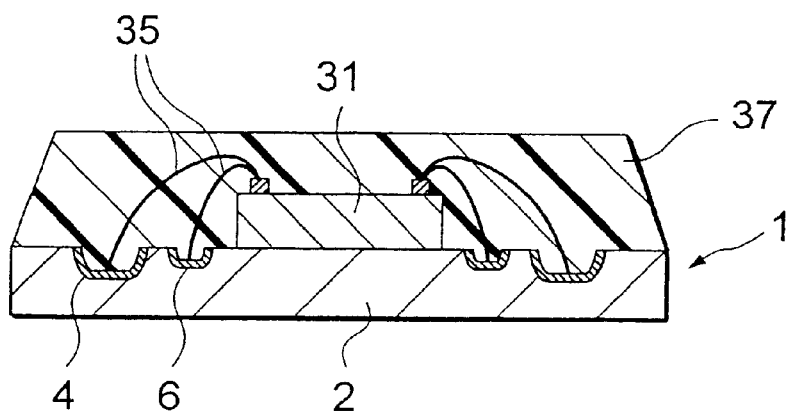
Figure 5C:
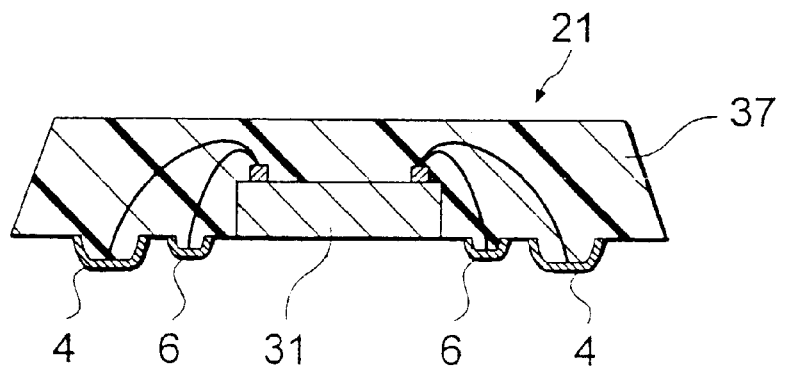

Then, the semiconductor device 31 with electrode terminals 4 and wire 6 mounted on substrate 2 and bonding wires 35 are coated with resin part 37 (FIG. 5B). Thereafter, only substrate 2 is peeled off from semiconductor device 31 with electrode terminals 4 and wire 6, so that resin-sealed semiconductor device 21 is obtained (FIG. 5C). In the resin-sealed semiconductor device 21, strengthening of power is possible by using electrode terminals 4 connected with wire 6 as power terminals. Alternatively, resin-sealed semiconductor device 21 can be obtained by a method for removing substrate 2 by etching after coating with resin member 37.

Figure 6:
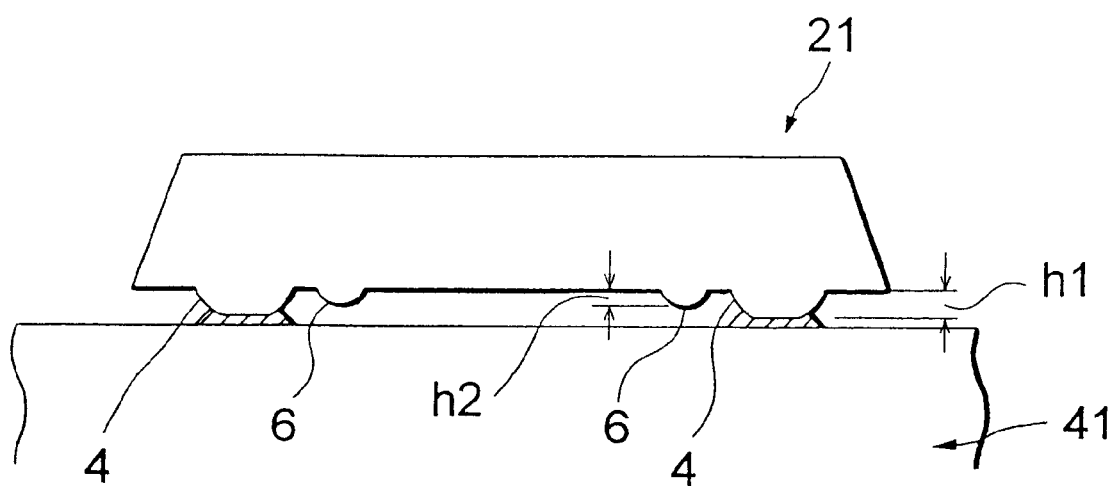
FIG. 6 is a view showing a state that the resin-sealed semiconductor device made by using the member for mounting of semiconductor of the present invention is soldered on a circuit substrate.

FIG. 6 is a view showing a state that resin-sealed semiconductor device 21 made in the above-mentioned way is soldered on a circuit substrate 41. As apparent from the drawing, the height h1 of electrode terminals 4 corresponds to the depth d1 of concave portions 3 for electrode of the member 1 for mounting of semiconductor, and the depth h2 of wire 6 corresponds to the depth d2 of concave portion 5 for wire of the member 1 for mounting of semiconductor. Accordingly, wire 6 is prevented from coming into contact with circuit substrate 41.

Then, another embodiment of a member for mounting of semiconductor is explained.

Figure 7:
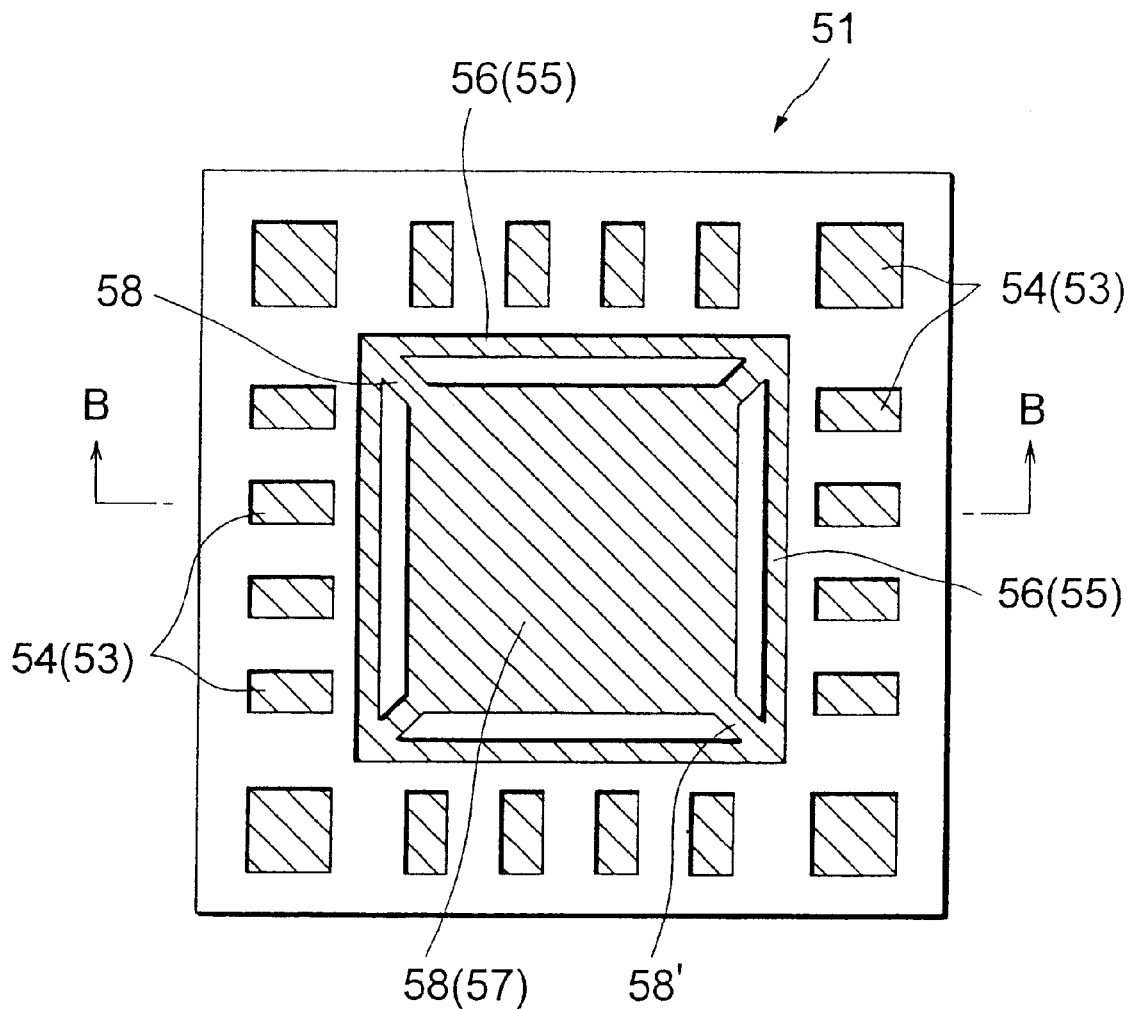
FIG. 7 is a plan view showing another embodiment of a member for mounting of semiconductor of the present invention.
Figure 8:
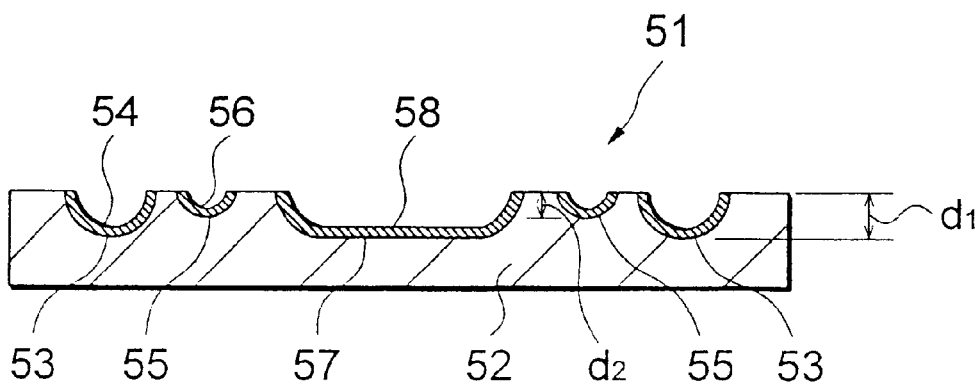
FIG. 8 is a vertical section taken on line B—B of the member for mounting of semiconductor shown in FIG. 7.

FIG. 7 is a view showing another embodiment of a member for mounting of semiconductor of the present invention. FIG. 8 is a vertical section taken on line B—B of the member for mounting of semiconductor shown in FIG. 7. As shown in FIGS. 7 and 8, a member 51 for mounting of semiconductor of the present invention is comprised of a flat substrate 52, a plurality of a concave portion 53 for electrode, a concave portion 55 for wire and a concave portion 57 for mounting of semiconductor device formed on one surface of the substrate 2, electrode terminals 54 formed in the concave portion 53 for electrode, wire 56 formed in the concave portion 55 for wire and a conductive layer 58 formed in the concave portion 57 for semiconductor device. In FIG. 7, areas of the above-mentioned elements 53, 54, 55, 56, 57 and 58 are shown with the shadowed portions. The depth d1 of concave portion 53 for electrode is larger than the depth d2 of concave portion 55 for wire, wherein the difference between d1 and d2 is preferably 10 $\mu$m to 50 $\mu$m.

Further, it is preferable that the depth of concave portion 57 for mounting of semiconductor is equal to the depth d1 of concave portion 53 for electrode.

Substrate 52 can be formed in the same manner as the above-mentioned substrate 2 of member 1 for mounting of semiconductor.

Concave portions 53 for electrode are independently arranged which are provided with electrode terminals 54 on the inner walls thereof. The depth d1 of the concave form thereof is set be 50 ■m to 150 ■m, the width thereof is set be 200 ■m to 500 ■m. In the illustrated example, twenty concave portions 53 for electrode are provided in substrate 52. However, this is merely illustration. The shape, the number and the arrangement thereof can be suitably determined. Electrode terminals 54 formed in concave portions 53 for electrode can be formed in the same manner as the above-mentioned electrode terminals 4 of member 1 for mounting of semiconductor device.

Concave portion 55 for wire is provided with wire 56 on the inner wall thereof. The wire 56 can be formed in the same manner as the above-mentioned wire 6 of member 1 for mounting of semiconductor.

Concave portion 57 for mounting of semiconductor device is provided with conductive layer 58 on the inner walls thereof. In the illustrated example, the conductive layer is connected with wire 56 through connecting portions 58' in four separate places. The conductive layer 58 is needed for using ground, power and others in common and for discharging heat from the resin-sealed semiconductor device explained hereinafter. Such a conductive layer 58 can be formed of thin film of one of noble metals of Ag, Pt, Au, Pd and others, or laminated film made of combination of layers of these noble metals. Further, the conductive layer can be formed of a laminated film of a film of the above-mentioned noble metals and film of metal such as Ni and others, wherein the outermost layers are formed of noble metals. The thickness thereof is preferably 1 ■m to 2 ■m.

Then, referring to FIG. 9, a method for producing a member for mounting of semiconductor of the present invention shown in FIGS. 7 and 8 is explained. FIG. 9 is a view of process showing another example for producing a member for mounting of member for mounting of semiconductor of the present invention, wherein individual process is illustrated by vertical section corresponding to the above-mentioned FIG. 8.

Figure 9A:
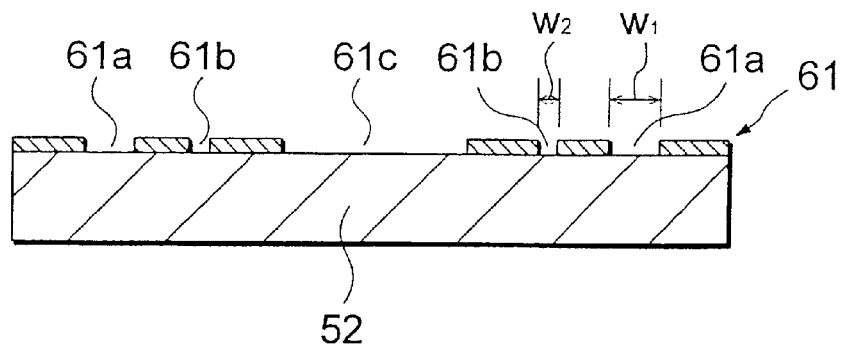
FIG. 9 to FIG. 9C are view of processes showing another embodiment of a method for producing a member for mounting of semiconductor of the present invention, giving as one example a member for mounting of semiconductor of the present invention shown in FIGS. 7 and 8.

As shown in FIG. 9, first, in the pattern-forming process, photosensitive resist is applied on substrate 52. The photosensitive resist is exposed to light through the appointed photomask and developed, by which resist pattern 11 is made (FIG. 9A). Material that degreasing treatment and cleaning treatment are made on both sides thereof can be preferably applied for substrate 52. Further, if photosensitive resist has etching resistance and plating resistance, it can be used without restriction. For example, using dry film resist having etching resistance and plating resistance, exposure and development are made in the same manner, by which resist pattern 11 can be formed.

The resist pattern formed in the above-mentioned way has openings 61a for electrode for forming concave portions for electrode, opening 61b for wire for forming concave portion for wire, and an opening 61c for mounting of semiconductor device forming a concave portion for mounting of semiconductor device. In the present invention, the opening width W1 of openings 61a for electrodes is set to be larger than the opening width W2 of opening 61b for wire. In such a manner, by setting the shape of resist pattern 11, the depth of half-cutting formed in the next etching process can be controlled every opening. Further, it is preferable to control the etching rate by using resist pattern with mesh pattern in the corresponding part to opening for mounting of semiconductor device.

In this case, for example, when opening 61a for electrode is formed into square, the opening width W1 of opening 61a for electrode is the length of side of square; when opening 61a for electrode is formed into rectangle, the opening width W1 of opening 61a for electrode is the length of short side of rectangle; when opening 61a for electrode is formed into a circle, the opening width W1 of opening 61a for electrode is a diameter and; when opening 61a for electrode is formed into ellipse, the opening width W1 of opening 61a for electrode is the length of short axis of ellipse. Even in case that opening 61b for wire is used for forming concave portion for wire 5 having the shape of corridor as shown in FIG. 1, the width of wire is the width of opening.

Figure 9B:
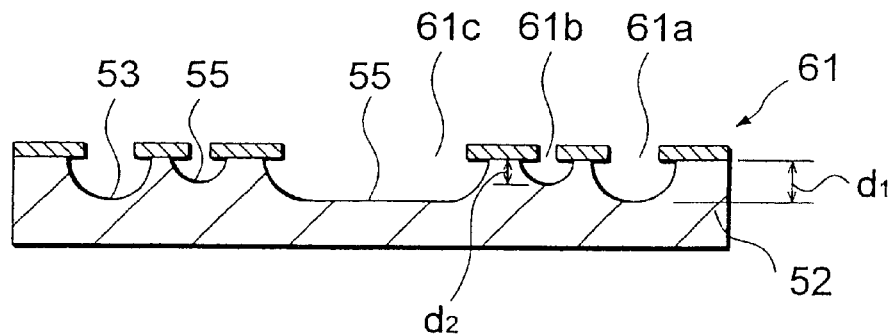

Then, in the etching process, substrate 52 is half-cut to form concave portions 53 for electrode, a concave portion 55 for wire and a portion 57 for mounting of semiconductor device on one surface of the substrate 52, by etching the substrate 52 through the resist pattern 51 as a mask (FIG. 9B). The depth d1 of the formed openings 53 for electrode is larger than the depth d2 of opening 55 for wire, and the depth of concave portion 57 for mounting of semiconductor is equal to that of openings 53 for electrodes. As above-mentioned, by changing the shape of resist pattern 61 to control etching factor, the depth d1 of openings 53 for electrode, the depth d2 of opening 55 for wire, and the depth of concave portion 57 for mounting of semiconductor device can be optionally controlled.

In case that the width of a part of concave portion for wire 55 should be formed locally larger than other area without a change in depth, in the above-mentioned pattern-forming process, the etching rate can be controlled in the direction of depth by using resist pattern with mesh pattern in the corresponding part. Etching, for example, spray etching can be made to half-cut substrate 52 from one side of substrate 52 on which resist pattern 61 is formed, by using solution of ferric chloride, ammonium persulfate and others according to material of substrate 2 as corrosive agent.

Figure 9C:
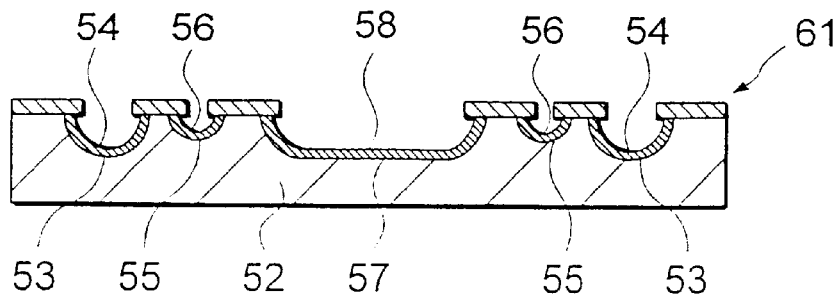

Then, in the plating process, by plating substrate 2 through the resist pattern 61 as a mask, electrode terminals 54 are formed on concave portions 53 for electrode, wire 56 is formed on concave portion 55 for wire, and conductive layer 58 is formed on a concave portion 57 for semiconductor device (FIG. 9C). Since the resist pattern 61 used in the above-mentioned plating process can be used as a mask as it is in the plating process, a method for producing a member for mounting of semiconductor according to the present invention is different from the conventional production of a member for mounting of semiconductor having wire in which two resist pattern forming processes are needed. Therefore, the number of process is decreased according to the present invention. Further, by forming etching pattern and plating pattern for forming electrode terminals 54, wire 56, and conductive layer 58 to the common pattern, fine patterning is made possible without restriction about the accuracy of alignment.

Thereafter, in the peeling process, resist pattern 61 on substrate 52 is peeled off from substrate 52, and the substrate 52 is cleaned, by which a member 51 for mounting of semiconductor according to the present invention shown in FIGS. 7 and 8 can be obtained.

Then, referring to FIG. 10, the production of resin-sealed semiconductor device made by using a member 51 for mounting of semiconductor according to the present invention is explained. FIG. 10 is a view showing another example of the production of resin-sealed semiconductor device, wherein the individual process is illustrated by vertical section corresponding to the above-mentioned FIG. 8.

Figure 10A:
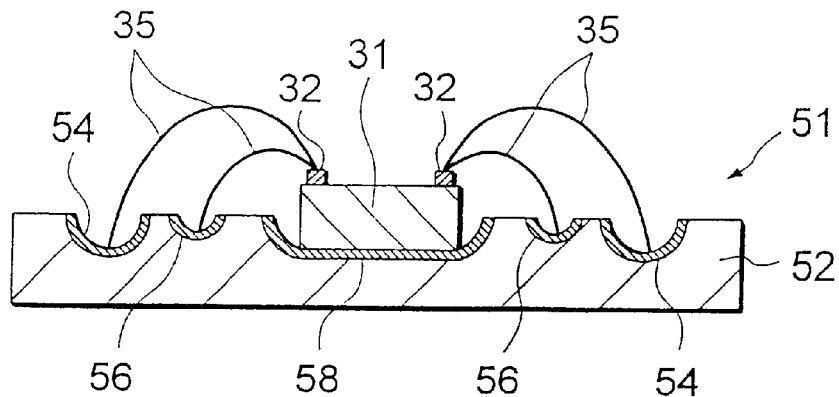
FIG. 10A to FIG. 10C are views showing another example of the production of resin-sealed semiconductor device made by using a member for mounting of semiconductor of the present invention.

First, as shown in FIG. 10A, semiconductor device 31 is mounted on conductive layer 58, and electric connection of electrode pads 32 of the semiconductor device 31 with electrode terminals 54 and wire 56 is made through bonding wire 35.

Figure 10B:
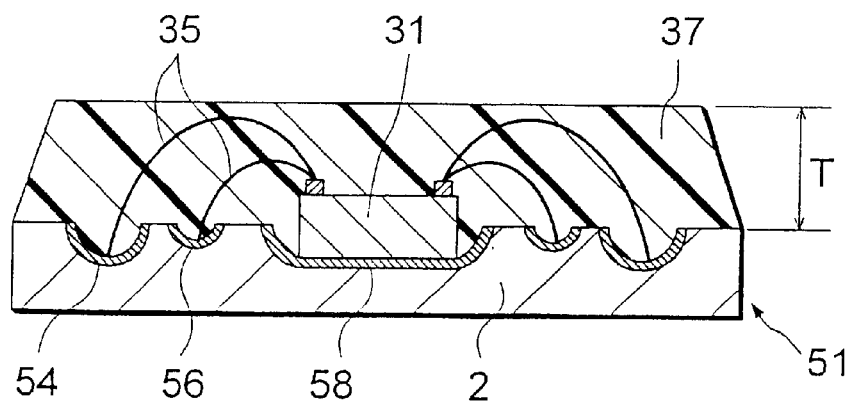

The semiconductor device 31 mounted on the member for mounting of semiconductor, electrode terminals 54, conductive layer 58 and bonding wire 35 are coated with resin part 37 (FIG. 10B). In a member 51 for mounting of semiconductor, since a part of semiconductor device 31 is inserted into concave portion 57 for mounting of semiconductor device, the thickness T of resin part 37 can be made thinner as compared with the above-mentioned member 1 for mounting of semiconductor is used. Further, keeping of the thickness T of resin part 37 makes the allowed extent of wiring of bonding wire 35 larger.

Figure 10C:
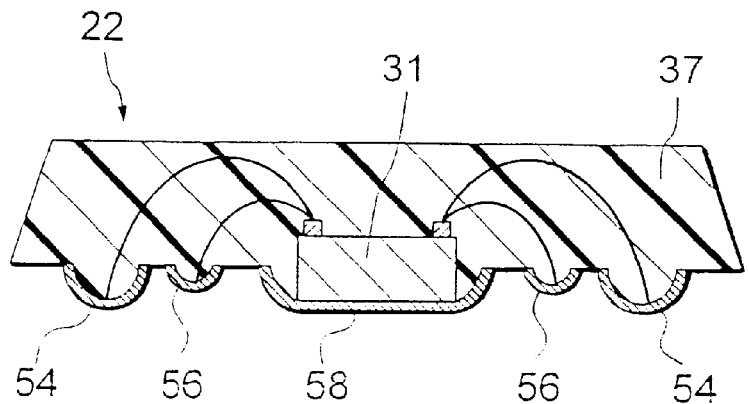

Thereafter, only substrate 52 is peeled off from semiconductor device 31 with electrode terminals 54, wire 56 and conductive layer 58, by which resin-sealed semiconductor device 22 can be obtained (FIG. 10C). When the resin-sealed semiconductor device 22 is soldered on a circuit substrate, wire 56 is prevented from coming into contact with substrate 56. Further, since conductive layer 58 is exposed to the outside, it is possible to effectively discharge heat generated from the semiconductor device 31 and others. Further, the resin-sealed semiconductor device 22 can be also obtained by removing substrate 52 by etching after coating semiconductor device with resin part 37.

Then, another embodiment of a member for mounting of semiconductor of the present invention is explained.

Figure 11:
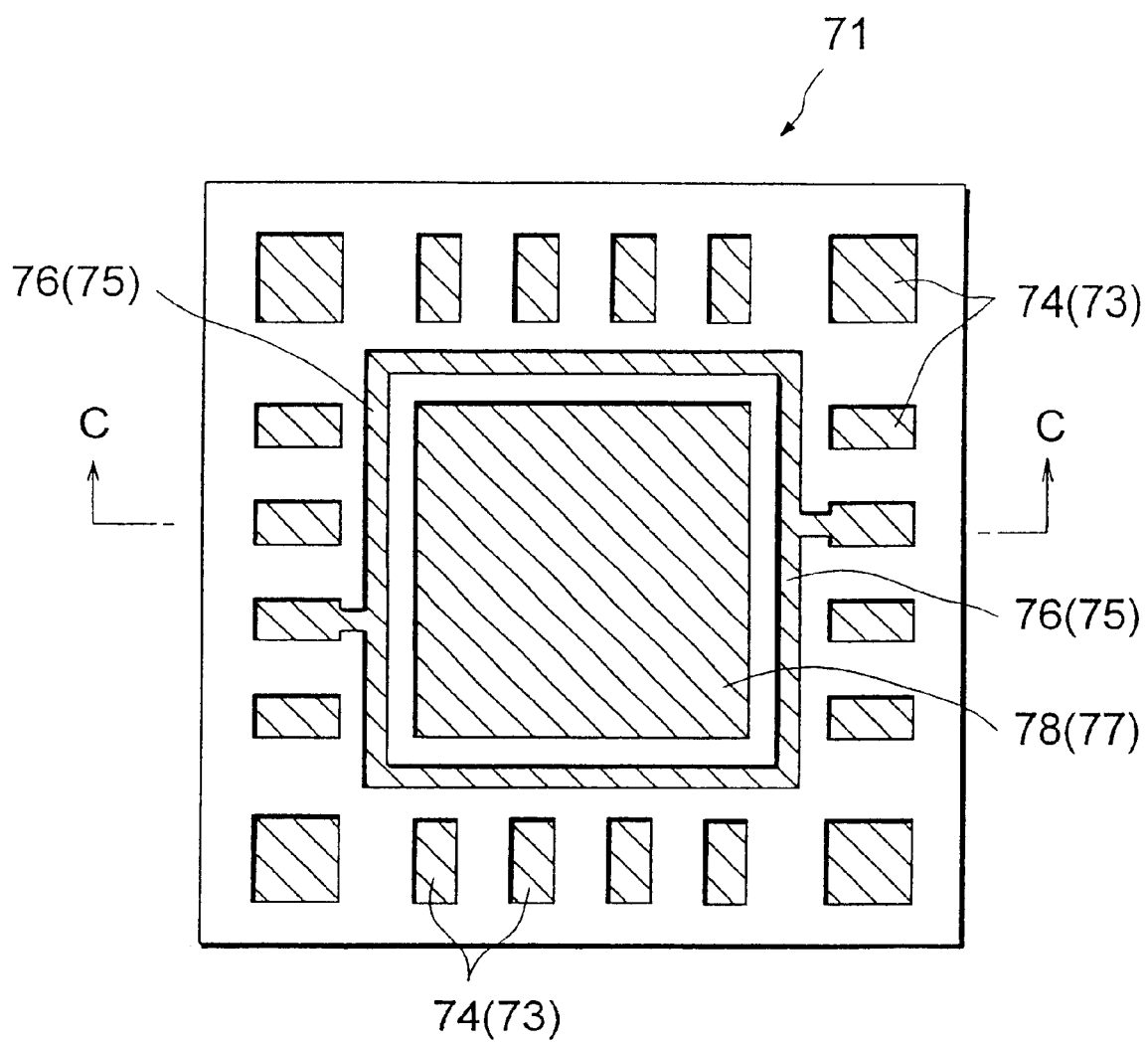
FIG. 11 is a view showing another embodiment of a member for mounting of semiconductor of the present invention.
Figure 12:
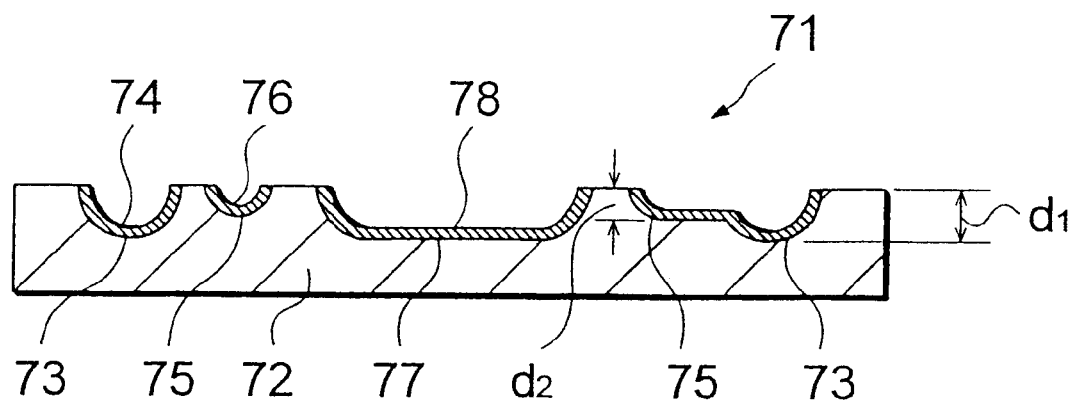
FIG. 12 is a vertical section taken on line C—C of the member for mounting of semiconductor shown in FIG. 11.

FIG. 11 is a plan view showing another embodiment of a member for mounting of semiconductor of the present invention. FIG. 12 is a vertical section taken on line C—C of the member for mounting of semiconductor shown in FIG. 11. As shown in FIGS. 11 and 12, a member 71 for mounting of semiconductor of the present invention is comprised of a flat substrate 72, a plurality of concave portions 73 for mounting of semiconductor, a concave portion 75 for wire and a concave portion 77 for mounting of semiconductor device formed one surface of the substrate 72, electrode terminals 74 formed in the concave portions 73 for electrode, wire 76 formed in the concave portion 75 for wire and conductive layer 78 formed in the concave portion 77 for mounting of semiconductor device. In FIG. 11, the areas of the above-mentioned elements 73, 74, 75, 76, 77 and 78 are shown with the shadowed portions. The depth d1 of concave portions 73 for electrode is larger than the depth d2 of concave portion 75 for wire, wherein the difference between d1 and d2 is preferably 10 ■m to 50 ■m. Further, it is preferable that the depth of concave portion for 77 mounting of semiconductor device is equal to the depth d1 of concave portion 73 for electrode.

Substrate 72 can be formed in the same manner as the above-mentioned substrate 2 of member 1 for mounting of semiconductor.

Concave portions 73 for electrode are independently arranged which are provided with electrode terminals 74 on the inner walls thereof. The depth d1 of the concave form thereof is set to be 50 ■m to 150 ■m, the width thereof is set to be 200 ■m to 500 ■m. In the illustrated example, twenty concave portions 73 for electrode are provided in the substrate 72, wherein two electrode terminals 74 are connected with wire 76. However, this is merely illustration. The shape, the number and the arrangement thereof can be suitably determined. Electrode terminals 74 formed in concave portions 73 for electrode can be formed in the same manner as the above-mentioned electrode terminals 4 of member 1 for mounting of semiconductor device.

Concave portion 75 for wire is provided with wire 76 on the inner wall thereof. The wire 76 can be formed in the same manner as the above-mentioned wire 6 of the member 1 for mounting of semiconductor.

Concave portion 77 for mounting of semiconductor device is provided with conductive layer 78 on the inner walls thereof, wherein the conductive layer 78 is formed inside wire 76 so as to be electrically separated from wire 76. The conductive layer 78 is needed for using ground, power and others and for discharging heat from the resin-sealed semiconductor device explained hereinafter. Such a conductive layer 78 can be formed in the same manner as the above-mentioned conductive layer 58.

Such a member 71 for mounting of semiconductor can be also produced in the same manner as the above-mentioned member 51 for mounting of semiconductor except forming the shape of openings of the formed resist pattern to the desired shape.

Figure 13:
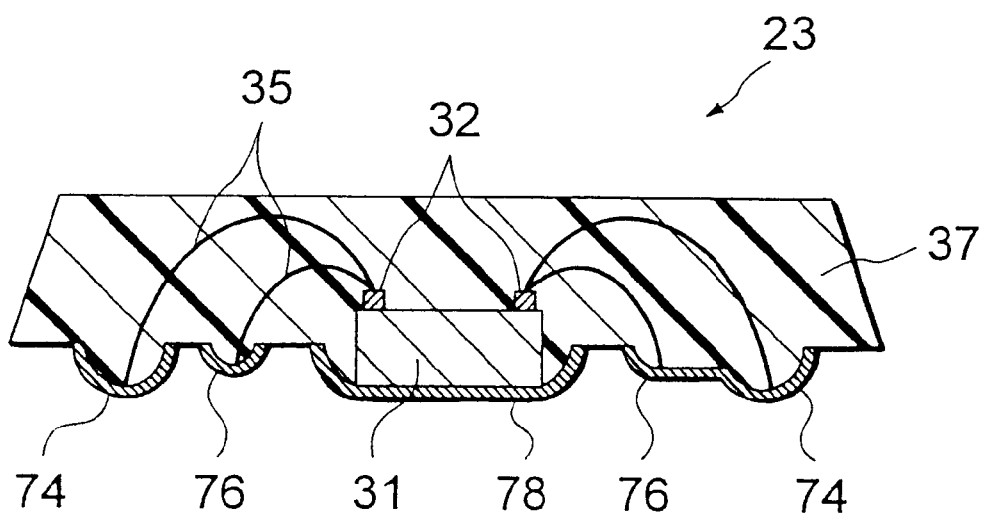
FIG. 13 is a vertical section showing an example of a resin-sealed semiconductor device made by using a member for mounting of semiconductor of the present invention.

FIG. 13 is a vertical section showing an example of a resin-sealed semiconductor device made by using a member 71 for mounting of semiconductor of the present invention. As shown in FIG. 13, in the resin-sealed semiconductor device 23, semiconductor device 31 is mounted on conductive layer 78, and electric connection of electrode pads 32 of the semiconductor device 31 with electrode terminals 74 and wire 76 is made through bonding wire 35, and semiconductor device 31, electrode terminals 74, wire 76, conductive layer 78 and bonding wire 35 are covered with resin part 37. In the resin-sealed semiconductor device 23, since a part of semiconductor 31 is inserted into concave potion 77 for mounting of semiconductor, the thickness of resin part 37 can be made thinner as compared with the above-mentioned member 21 for mounting of semiconductor. Further, keeping of the thickness of resin part 37 makes the allowed extent of wiring of bonding wire 35. Further, when the resin-sealed semiconductor device 23 is soldered on a circuit substrate, wire is prevented from coming into contact with the circuit substrate. Further, since conductive layer 78 is exposed to the outside, heat generated in semiconductor device 31 and others can be effectively discharged. Further, strengthening of power is possible by using electrode terminals 4 connected with wire 76 as power terminals.

Then, another embodiment of member for mounting of semiconductor is explained.

Figure 14:
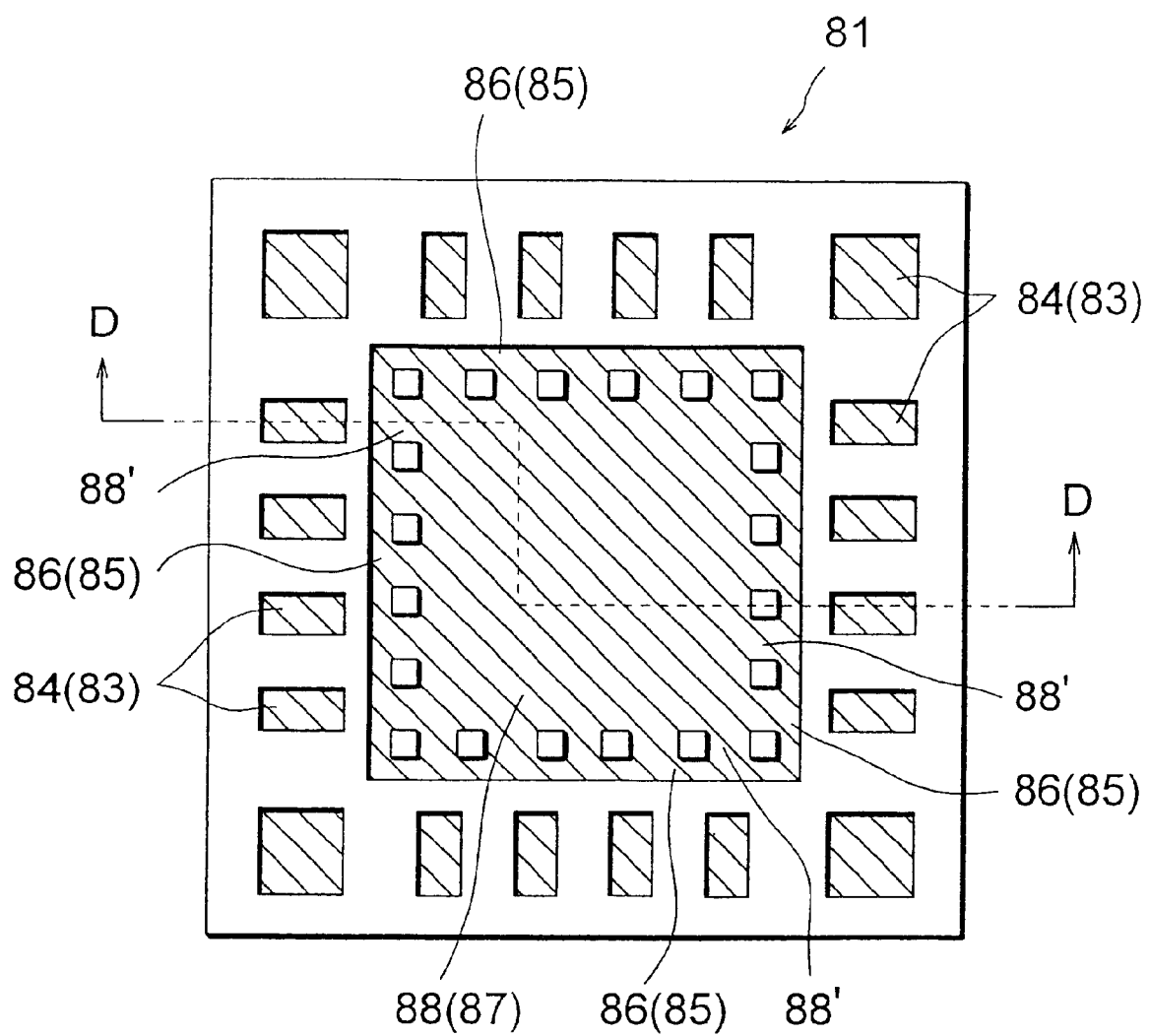
FIG. 14 is a plan view showing another embodiment of a member for mounting of semiconductor of the present invention.
Figure 15:
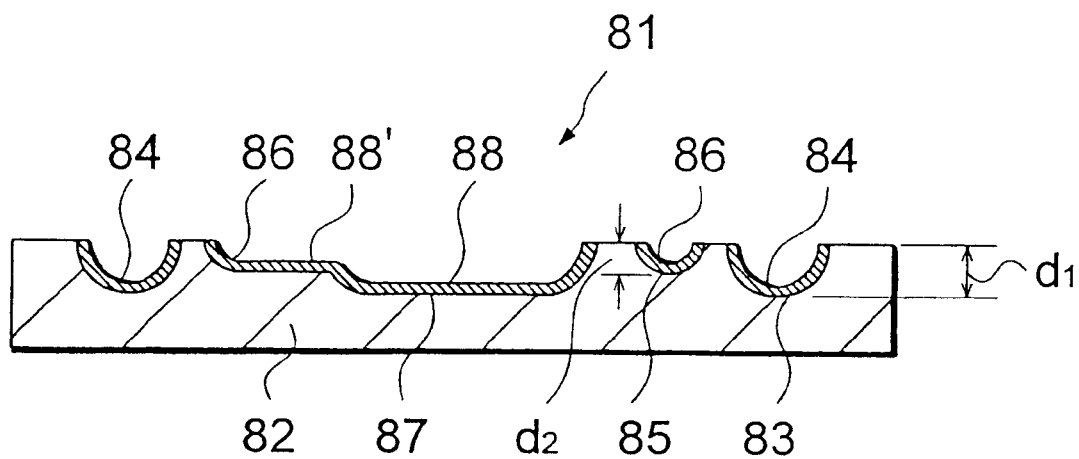
FIG. 15 is a vertical section taken on line D—D of the member for mounting of semiconductor shown in FIG. 14.

FIG. 14 is a plan view showing another embodiment of a member for mounting of semiconductor of the present invention. FIG. 15 is a vertical section taken on line D—D of the member of semiconductor of the present invention. As shown in FIGS. 14 and 15, a member 81 for mounting of semiconductor of the present invention is comprised of a flat substrate 82, a plurality of concave portions 83 for electrode, a concave portion 85 for wire, and a concave portion 87 for mounting of semiconductor device formed on one surface of the substrate 82, electrode terminals 84 formed in the concave portions 83 for electrodes, conductive layer 88 formed in the concave portion 83 for electrodes, wire 86 formed in the concave potion 85 for wire and conductive layer 88 formed in the concave portion 87 for mounting of semiconductor device. In FIG. 14, areas of the above-mentioned elements 83, 84, 85, 86, 87, 88 are shown with the shadowed portions. The depth d1 of concave portions 83 for electrode is larger than the depth d2 of concave portion 85 for wire, wherein the difference between d1 and d2 is preferably 10 µm to 50 µs. Further, the depth of concave portion 87 for semiconductor is preferably the same as the depth d1 of concave portions 83 for electrodes.

Substrate 82 can be formed in the same manner as substrate 2 of the above-mentioned member 1 for mounting of semiconductor.

Concave portions 83 for electrode are independently arranged which are provided with electrode terminals 84 on the inner walls thereof. The depth of the concave form thereof can be set to be 50 µm to 150 µm, and the width thereof can be set to be 200 µm to 500 µm. In the illustrated example, twenty concave portions 83 for electrode are provided on substrate 82. However, this is merely illustration. The shape, the number, the arrangement and others thereof can be suitably determined. Electrode terminals 84 formed in the concave portions 83 for electrode can be formed in the same manner as wire 6 of the above-mentioned member 1 for mounting of semiconductor.

Concave portion 85 for wire is provided with conductive layer 88 on the inner wall thereof. Wire 86 can be formed in the same manner as wire 6 of member 1 for mounting of semiconductor.

Concave portion 87 for mounting of semiconductor device is provided with conductive layer 88 on the inner wall thereof. In the illustrated example, conductive layer 88 is connected with wire 86 through connecting portions 88' in a plurality of points. The conductive layer 88 is needed for using ground, power and others in common and for discharging heat from the resin-sealed semiconductor device. The conductive layer 88 can be formed in the same manner as the above-mentioned conductive layer 58.

The member 81 for mounting of semiconductor 81 can be produced in the same manner as the above-mentioned member 51 for mounting of semiconductor except using resist pattern having openings with different shape.

Figure 16:
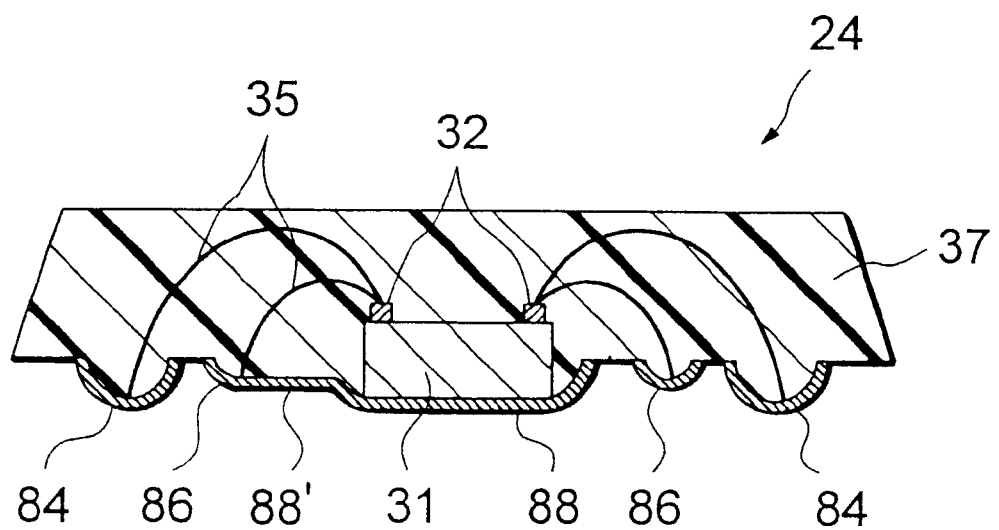
FIG. 16 is a vertical section showing an example of resin-sealed semiconductor device made by using a member for mounting of semiconductor of the present invention.
Figure 17A:
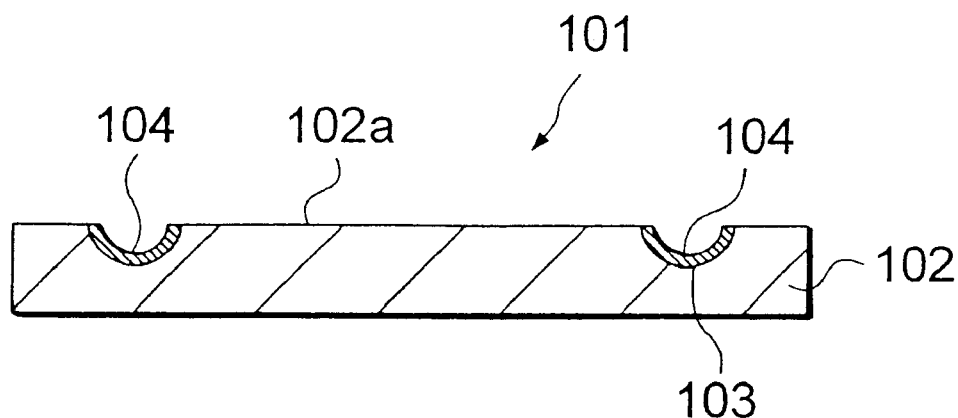
FIGS. 17A and 17B are views for illustrating a conventional member for mounting of semiconductor, FIG. 17A being a vertical section of a member for mounting of semiconductor, and FIG. 17B being a vertical section showing a resin-sealed semiconductor device made by using the member for mounting of a semiconductor, respectively.
Figure 17B:
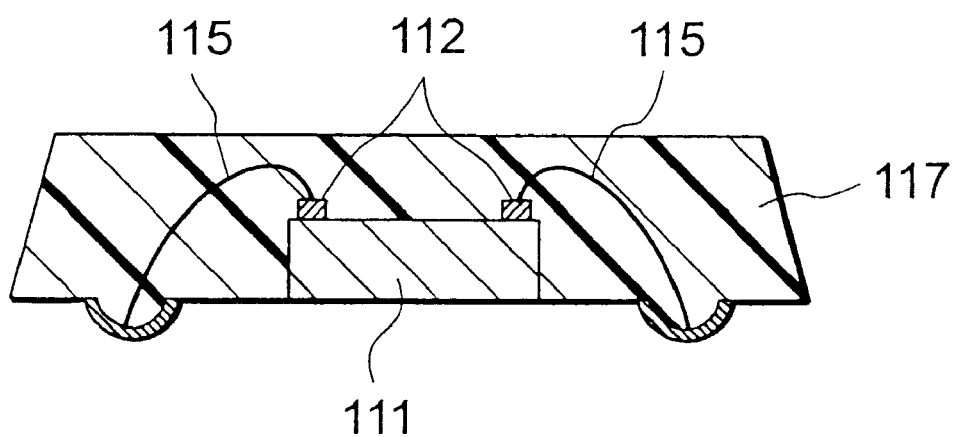
Figure 18A:
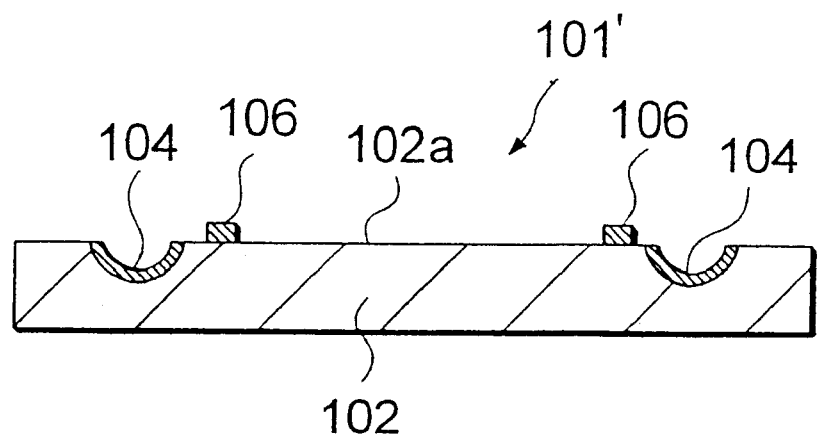
FIGS. 18A and 18B are views for illustrating a conventional member for mounting of semiconductor, FIG. 18A being a vertical section of a member for mounting of semiconductor, and FIG. 18B being a view for illustrating the production of a resin-sealed semiconductor device made by using the member for mounting of semiconductor, respectively.
Figure 18B:
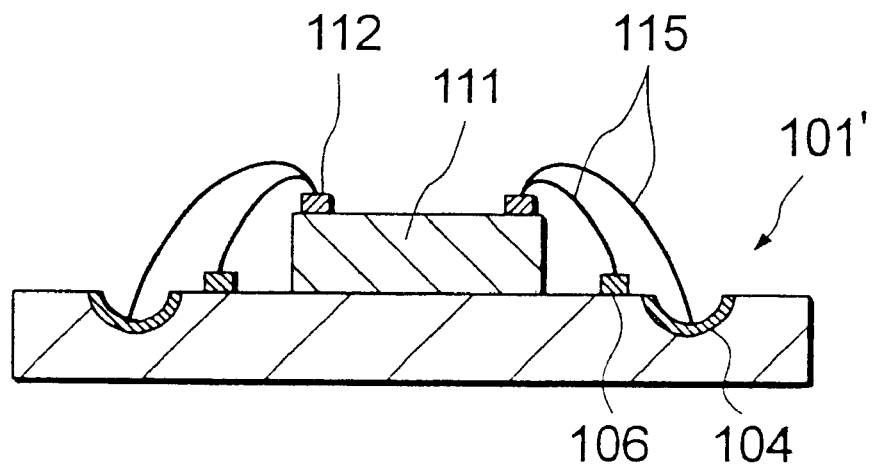

FIG. 16 is a vertical section showing a resin-sealed semiconductor device made by using a member 81 for mounting of semiconductor of the present invention. As shown in FIG. 16, in resin-sealed semiconductor device 24, semiconductor 31 is mounted on conductive layer 88. Electrode pads 32 of the semiconductor device 31 are mounted electrically connected with electrode terminals 64 and wire 86 through bonding wire 35. Semiconductor 31, electrode terminals 84, wire 86, conductive layer 88 and bonding wire 35 are coated with resin part 37. In the resin-sealed semiconductor device 24, since a part of semiconductor device 31 is inserted into concave portion 87 for mounting of semiconductor device, the thickness of resin part 37 can be made thinner as compared with the above-mentioned resin-sealed semiconductor device 21. Further, keeping the thickness of resin part 37 makes the allowed extent of wiring of bonding wire 35 larger. Further, when the resin-sealed semiconductor device 24 is soldered on a circuit substrate, wire 86 is prevented from coming into contact with the circuit substrate. Further, since conductive layer 88 is exposed to the outside, heat generated in semiconductor device 31 and others can be effectively discharged.

(EXAMPLE)

Then, the present invention is explained a concrete example.

Copper alloy plate of 0.127 mm thickness (manufactured by Furukawa electric industry Ltd., TEC64T-½H) was prepared as metallic substrate, for which degreasing treatment and cleaning treatment were made. Then, the front of the copper alloy plate was laminated with dry film resist having etching resistance and plating resistance. The dry film resist was exposed to light through the appointed photomask, and developed, by which resist pattern of 25 µm thickness provided with openings for electrode and an opening for wire was formed. In the resist pattern, the openings for electrode were circular openings with the opening width (diameter) of 180 µm, and the opening for wire was opening in the shape of corridor of the opening width of 30 µm. (The above-stated concerns the pattern-forming process).

Then, etching of the substrate was made through the above-mentioned resist pattern as a mask, wherein etching was made by using ferric chloride solution at 50 µ, 40° Bé (Baumé degree), and spraying pressure of 2 kg/cm². Amount of etching was set so that half-etching or half-cutting was made in such a manner that concave portions for electrode of 80 µm depth was formed in areas of substrate exposed to light through the openings for electrodes of the resist pattern. In this time, an area of the substrate exposed though an opening for wire of 30 µm width was half-cut with 40 µm depth and 60 µm width, by which a concave portion for wire was formed. (The above-stated concerns the etching process).

Then, using the same resist pattern as a mask, a thin laminated film of the structure of five or more layers was formed on the concave portions for electrode and on the concave portion for wire. Namely, first, gold plating layer of 0.1 µm thickness and palladium plating layer of 0.5 µm for increasing wetting of solder, then nickel plating layer of 5 µm were formed as barrier-metal, and further palladium plating layer of 0.5 µm was formed for making wire-bonding. Hereby, electrode terminals were formed in the concave portions for electrode, and wire was formed in the portion for wire, respectively. (The above-stated concerns the plating process)

Then, the resist pattern was removed off from the substrate with sodium hydroxide solution. The substrate was cleaned with deionized water, and dried so that a member for mounting of semiconductor was obtained.

Semiconductor device was mounted on a central flat area of the above-mentioned member for mounting of semiconductor in such a manner that the backside of semiconductor device was brought into contact with the central flat surface. Then, connection of electrode terminals and wire of the member for mounting of semiconductor with terminals of semiconductor device was made through golden wires of 25 µm diameter. In this wire bonding, second bonding can be made also continuously and without problem within the winding area of 60 µm width and 40 µm depth so that it was confirmed that shear strength of wire bonding was sufficient.

Then, sealing was made with resin. Thereafter, substrate was removed completely by dissolving out substrate of copper alloy plate by spray etching with ammoniacal alkaline copper etching solution, so that electrode terminals and wire were exposed to the outside. As a result, a resin-sealed semiconductor device, in which several terminals and wire were electrically insulated, could be obtained.

When the resin-sealed semiconductor device was soldered on a circuit substrate, a wiring part was not brought into contact with the circuit substrate.

As mentioned hereinabove, a member for mounting of semiconductor according to the present invention has a concave portion for wire and concave portions for electrode wire which are provided on one surface of the substrate, wherein the concave portions for electrode is deeper than the concave portion for wire, electrode terminals being formed in the concave portions for electrode, and wire being formed in the concave portion for wire. Hereby, a small-sized resin-sealed semiconductor device can be produced by mounting a semiconductor on a central flat area of the substrate, electrically connecting electrode pads of semiconductor device with electrode terminals and wire through bonding wires, sealing semiconductor, electrode terminals, wire and bonding wire with resin, and thereafter removing only substrate from resin-sealed matters. When the resin-sealed semiconductor device was soldered on a circuit substrate through electrode terminals, wire is not brought into contact into the circuit substrate. Further, since the member for mounting of semiconductor can be produced through only one resist pattern-forming process, and thereafter etching process and plating, the producing method according to the present invention is simple than conventional producing method in which two pattern forming processes are needed. Further, since alignment is not needed when forming concave portions for electrode and a concave portion for wire, a member for mounting of semiconductor having finer wire than a conventional member for mounting of semiconductor is made.

What is claimed is:

1. A member for mounting of a semiconductor comprising a substrate, said substrate having concave portions for receiving electrode terminals and a concave portion for receiving wire on one surface of the substrate, electrode terminals formed in the concave portionss for receiving electrode terminals, a wire formed in the concave portion for receiving wire, wherein the concave portions for electrode terminals are formed deeper into the substrate than the concave portion for receiving wire.

2. The member for mounting of a semiconductor as claimed in claim 1, wherein a concave portion for mounting a semiconductor device is formed inwardly from the concave portion for receiving wire and a conductive layer is provided in the concave portion for mounting a semiconductor device.

3. A member for receiving a semiconductor comprising:
   a substrate having first and second opposing flat surfaces;
   first concave portions projecting into the first flat surface of said substrate;
   a second concave portion projecting into the first surface of said substrate, said second concave portion having a lesser depth than said first concave portions;
   electrode terminals received in the first concave portions; and
   an electrical contact received in the second concave portion.

4. The member for receiving a semiconductor of claim 3, wherein the first concave portions comprise a plurality of discrete concave portions spaced about a perimeter of the first surface of said substrate, and the second concave portion comprises a continuous trough extending about a center of said flat first surface, said trough being spaced inwardly from said first concave portions on the first surface of said substrate.

5. The member for receiving a semiconductor of claim 4, including a third concave portion projecting into the center of the first surface of said substrate for mounting a semiconductor device, wherein said third concave portion is located inwardly from said trough at the center of the first surface of said substrate.

6. The member for receiving a semiconductor of claim 5, wherein said trough forms an outline having a rectangular shape spaced from and extending about the entire periphery of said third concave portion, and said third concave portion comprises a rectangular shaped opening for receiving the semiconductor device.

7. The member for receiving a semiconductor of claim 6, wherein said third concave portion has a depth equal to the depth of said first concave portions.

8. The member for receiving a semiconductor of claim 6, including fourth concave portions projecting into the first surface of said substrate and providing openings joining said second concave portion and said third concave portion.

9. The member for receiving a semiconductor of claim 3, comprising:
   a third concave portion projecting into the first flat surface of said substrate for mounting said semiconductor device, said third concave portion located inwardly toward a center of said semiconductor device from said first concave portions and said second concave portion, said third concave portion receiving a conductive layer therein; and
   fourth concave portions projecting into the first surface of said substrate and providing openings between said second concave portion and said third concave portion.

10. The member for receiving a semiconductor of claim 9, wherein said first concave portions comprise a plurality of discrete concave portions spaced about a perimeter of the second concave portion.

* * * * *